United States Patent [19]

Farmer et al.

[11] Patent Number: 5,572,209

[45] Date of Patent: Nov. 5, 1996

[54] METHOD AND APPARATUS FOR COMPRESSING AND DECOMPRESSING DATA

[75] Inventors: Henry R. Farmer, Colchester; Anne A. Wilson, Waterbury, both of Vt.

[73] Assignee: International Business Machines Corporation, Armonk, N.Y.

[21] Appl. No.: 291,694

[22] Filed: Aug. 16, 1994

[51] Int. Cl.⁶ .................................................. H03M 7/30
[52] U.S. Cl. .................................................. 341/67
[58] Field of Search .................. 341/67, 50, 87; 395/162, 163, 164, 165, 166

[56] References Cited

U.S. PATENT DOCUMENTS

| | | |
|---|---|---|
| 5,058,137 | 10/1991 | Shah . |
| 5,150,430 | 9/1992 | Chu . |
| 5,153,591 | 10/1992 | Clark . |
| 5,179,378 | 1/1993 | Ranganathan et al. . |
| 5,226,119 | 7/1993 | Asai . |
| 5,243,341 | 9/1993 | Seroussi et al. . |
| 5,245,338 | 9/1993 | Sun . |
| 5,262,776 | 11/1993 | Kutka . |
| 5,274,638 | 9/1993 | O'Brien et al. . |
| 5,367,629 | 11/1994 | Chu et al. .............................. 395/162 |

OTHER PUBLICATIONS

QIC Development Standard, "Adaptive lossless Data Compression (ADLC)" WIC–154 Rev. A, Mar. 10, 1994, 8 pages.

Primary Examiner—Brian K. Young
Attorney, Agent, or Firm—William P. Skladony; Robert A. Walsh

[57] ABSTRACT

A data processing system having a compression and decompression apparatus based on the Lempel-Ziv algorithm. The compression apparatus includes a history RAM unit for receiving and storing one or more data elements and a coding unit for determining whether received data elements previously have been stored in the history RAM unit and are a candidate for compression. If a received data element matches at least one of the stored data elements, an address of the matching stored data element is generated. The compression apparatus generates a compression token comprising an identification of whether a data element is compressed, the length of the coded data within a plurality of predetermined data length categories and an address. The decompression apparatus also includes a history RAM unit for storing received data elements and includes a circuit for receiving a compression token and determining the storage addresses of the next data element from the length and address information contained in the token. The apparatus can identify the next address at high speed by a parallel processing using the predetermined length categories.

20 Claims, 13 Drawing Sheets

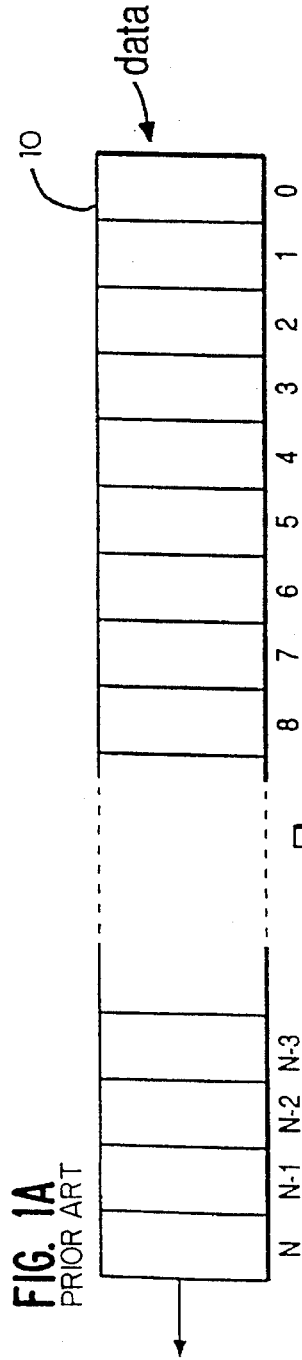
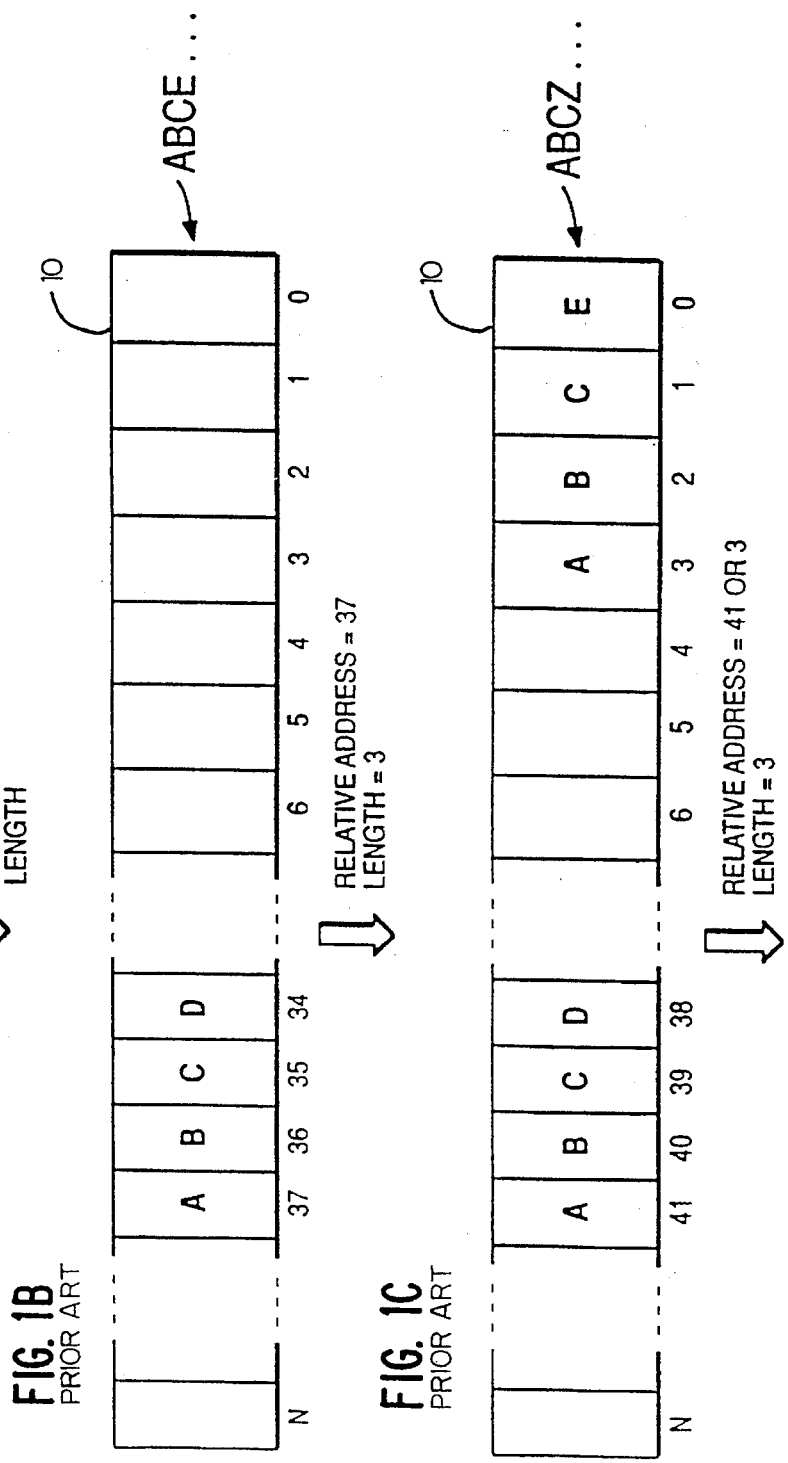
FIG. 1A PRIOR ART
FIG. 1B PRIOR ART
FIG. 1C PRIOR ART

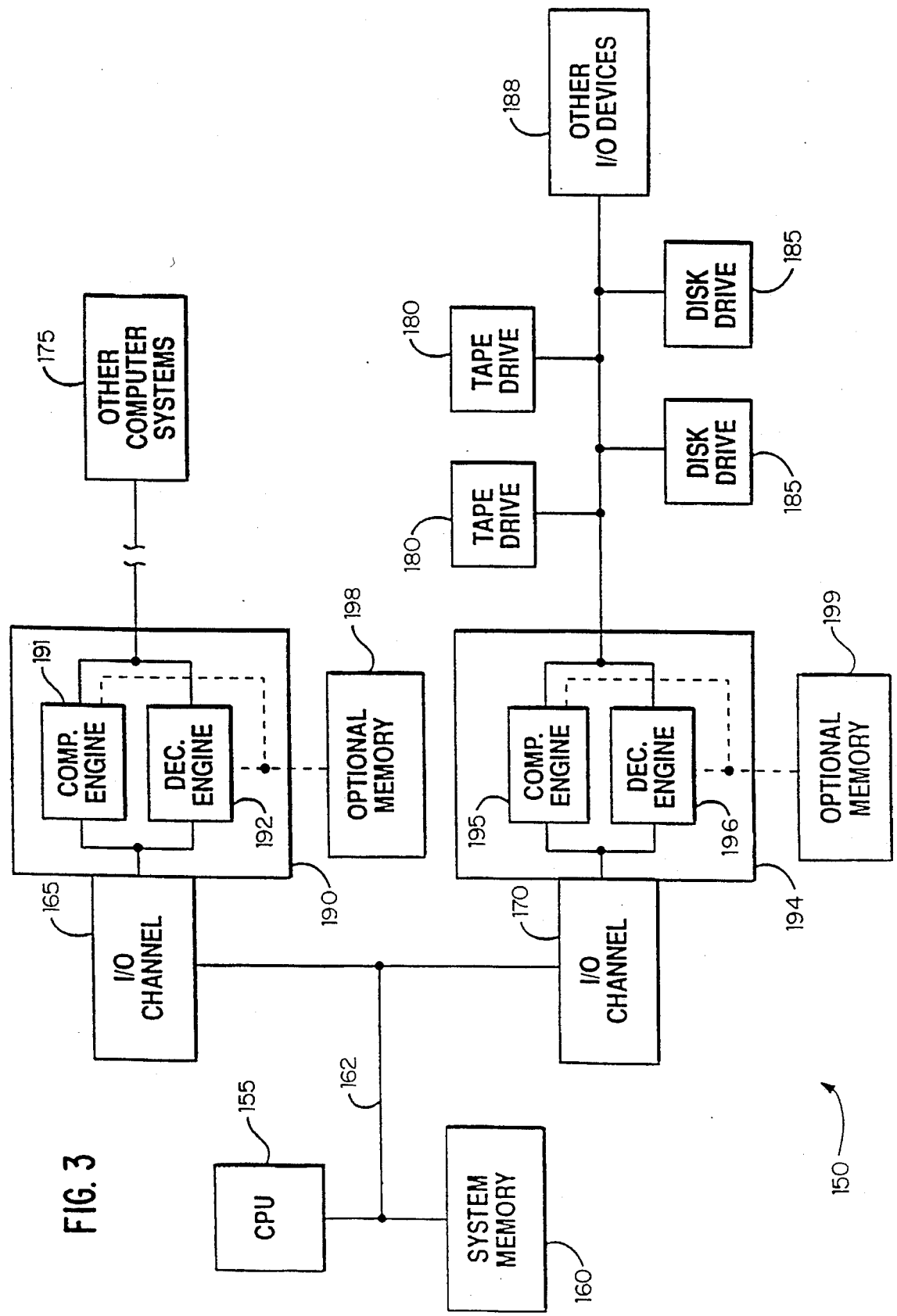

| Case | Code | Code Length (2K RAM) | Description |
|---|---|---|---|
| 1.) | 0bbbbbbbb | 9 | Raw Byte |
| 2.) | 10Lddddddd | 14 | Length = 2 - 3 |
| 3.) | 110LLddddddd | 16 | Length = 4 - 7 |
| 4.) | 1110LLLddddddd | 18 | Length = 8 - 15 (LLL = 000, 001, ..., 111) |
| 5.) | 11110LLLLddddddd | 20 | Length = 16 - 31 (LLLL = 0000, 0001, ..., 1111) |
| 6.) | 111111LLLLLLLLddddddd | 24 | Length = 32 - 271 (LLLLLLLL = 00000000 - 11101111) |

| code data | description |
|---|---|
| "0bbbbbbb" | — 0 plus ASCII code for "t" |
| "0bbbbbbb" | — 0 plus ASCII code for "h" |
| "0bbbbbbb" | — 0 plus ASCII code for "e" |
| "0bbbbbbb" | — 0 plus ASCII code for " " |
| "0bbbbbbb" | — 0 plus ASCII code for "b" |
| "0bbbbbbb" | — 0 plus ASCII code for "o" |
| "0bbbbbbb" | — 0 plus ASCII code for "y" |
| "0bbbbbbb" | — 0 plus ASCII code for " " |
| "110LLdddddddd" | — length=04, displacement=0 (note 1) |
| "0bbbbbbb" | — 0 plus ASCII code for "d" |
| "0bbbbbbb" | — 0 plus ASCII code for "o" |
| "0bbbbbbb" | — 0 plus ASCII code for "g" | note 1 - LL=00, dddddddd = 00000000 here to code length=4, d=0. So the actual compressed code is "110000000000000".

FIG. 4C

| word # | 16-bit words |
|---|---|
| 1 | 0bbbbbbb0bbbbbb |
| 2 | bb0bbbbbb0bbbb |
| 3 | bbbb0bbbbbb0bb |
| 4 | bbbbbb0bbbbbb0 |
| 5 | bbbbbbb1011ddd |
| 6 | dddddd0bbbbbbb |
| 7 | b0bbbbbbb0bbbbb |
| 8 | bbb | bit 0 ---- ◀ bit 15 ---- ◀

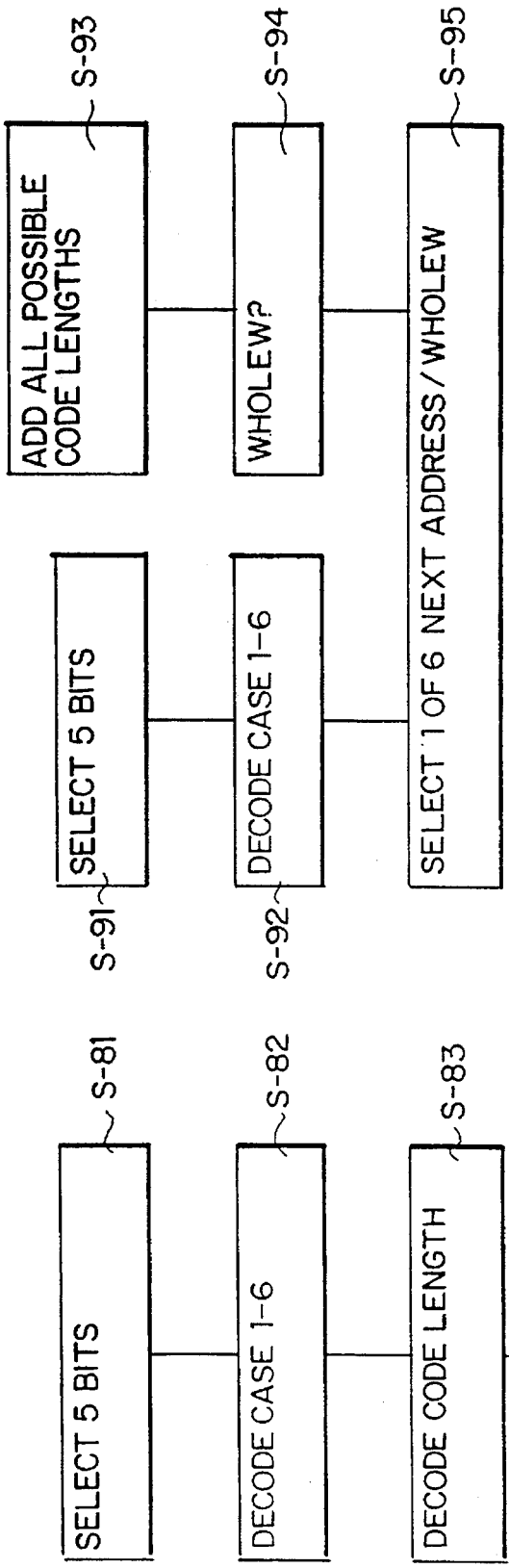
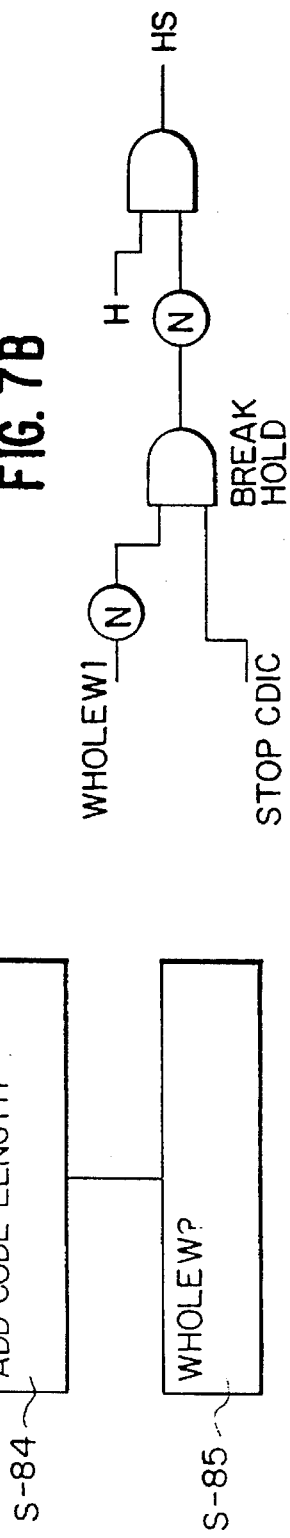

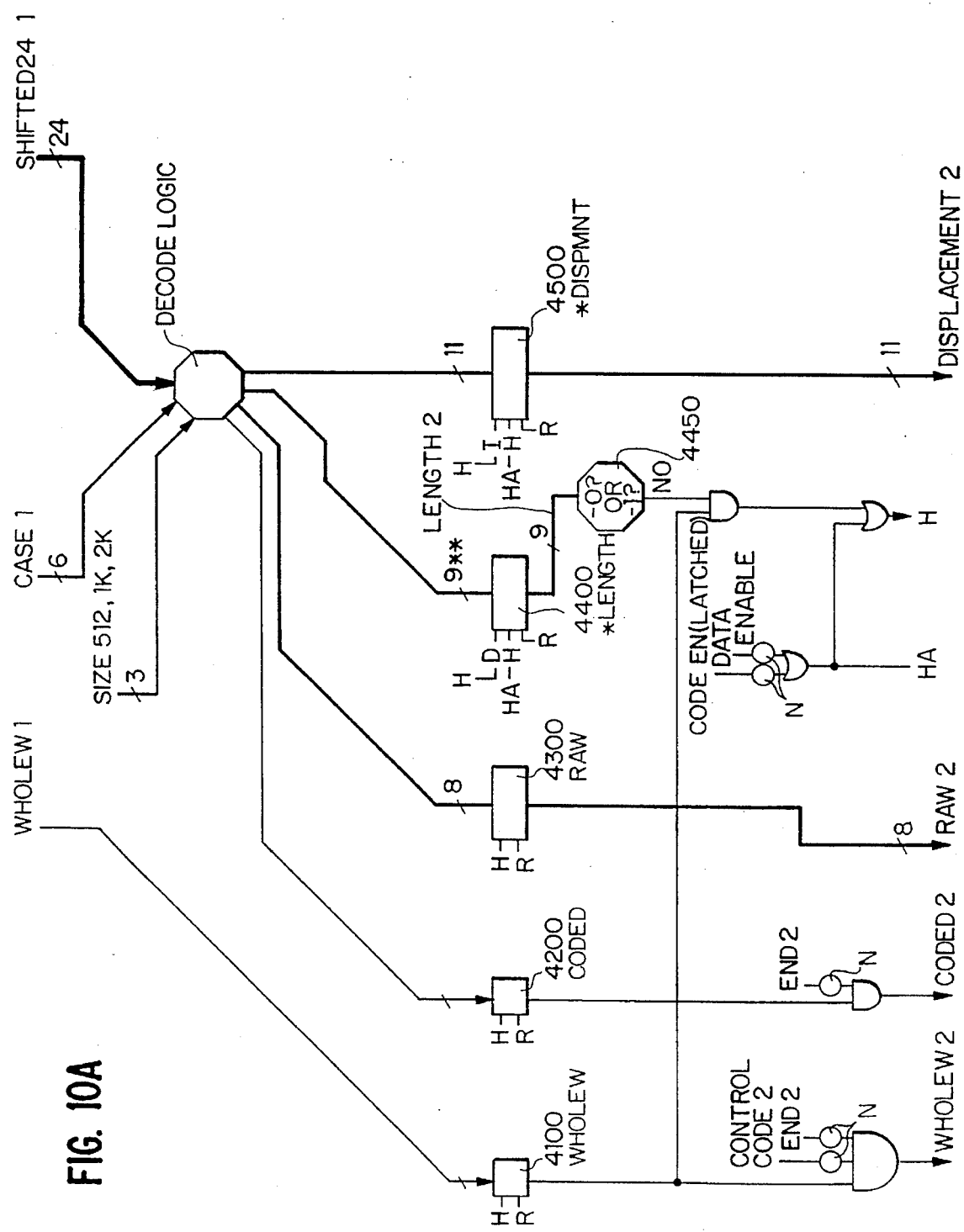

METHOD AND APPARATUS FOR COMPRESSING AND DECOMPRESSING DATA

BACKGROUND OF THE INVENTION

1. Field of the Invention

The present invention is directed to an apparatus and method for compressing data and correspondingly decompressing the compressed data, and more specifically to the decompression of data compressed in accordance with a Lempel-Ziv-type algorithm.

2. Description of the Background Art

The basic Lempel-Ziv algorithm, which is described in "Compression of Individual Sequences via variable Rate Coding" by Lempel and Ziv in IEEE Transactions on Information Theory, September, 1977, pages 530–536, has served as a basis for effective data compression and, recently, has gained in popularity as a basis for high speed data transmission.

The basic implementation of the Lempel-Ziv algorithm is illustrated in FIGS. 1A–1C. In FIG. 1A, a shift register 10 that is N+1 bytes long is used to temporarily store previously processed data. If new data to be processed includes a string of data bytes that have been processed before, then a token including the length and relative address of the previously processed data string in the shift register will be generated. Generally, the new data which includes such string of previously processed data bytes can be expressed using fewer bits of information than that contain in the data string itself. Consequently, the data string is effectively compressed. If the new data to be processed does not form part of a previous data string existing in the shift register, however, there can be no compression and a token or tokens must be generated to specifically signify this condition. In general, such tokens have to be expressed using slightly more bits of information than the data itself, so there is an effective expansion. Overall, the gain from the compressed data strings usually exceeds the losses from the non-compressed data strings, so overall data compression results. If there are no repeating strings of data in a data stream, then the data steam can not be compressed by this technique.

FIG. 1B illustrates the generation of a token referencing previously processed data. In the example given, the values A, B, C and D were previously processed and are currently stored in the shift register at addresses 37, 36, 35 and 34. New values to be processed are A, B, C and E. The new data includes the string ABC that has a length of 3 and matches previously stored string ABC at relative address 37. The address is relative because once a token is generated describing the string, the values A, B, and C will be loaded into the shift register and the values A, B, C and D will be shifted down the shift register to a new address. The address of data in the shift register is relative to the number of data values subsequently processed.

FIG. 1C illustrates the generation of a second token referencing previously stored data. In the example given, the values A, B, C and Z are to be processed. The new data includes the string ABC that has a length of 3 and matches the previously stored string ABC at relative addresses 3 and 41. The token generated in this example is usually the lower relative address of 3. Tokens include the count and relative address of the previously processed string and are expressed as (count, relative address). As a result of the compression of the values A, B, C, E, A, B, C and Z as shown in FIGS. 1B and 1C, the generated processed output will include: (3, 37), E, (3,3), Z.

One problem with the implementation of the Lempel-Ziv compression technique is the difficulty in performing the search operation for previous matching strings at an effective processing speed. This problem arises from the use of relative or relational addresses in the compression process, such that the addresses are changed. Specifically, as explained with respect to FIGS. 1A–1C, the relative addressing scheme requires the use of a shift register to hold previously processed data words, one word in each data element. Each incoming data word is shifted into the first position of the shift register while all the previously processed data words are shifted into adjacent positions. In addition, a random access capability is required for each element of the shift register. This requires much more circuitry, chip area, and power to implement than a simple random access memory.

A variety of techniques have been proposed for implementing the Lempel-Ziv compression algorithm, many of which focus on improving the speed of the search operation of or the amount of compression achieved by using more efficient token encoding, as seen in the following issued patents:

U.S. Pat. No. 5,150,430 which concerns the use of the Lempel-Ziv algorithm for compressing data using parallel shift register-based compression units, and a decoder which compares tally values with stored length values.

U.S. Pat. No. 5,153,591 which concerns data compression and decompression utilizing a simplified Lempel-Ziv algorithm having a tree structure for a compression dictionary;

U.S. Pat. No. 5,179,378 which concerns data compression and decompression using Lempel-Ziv techniques and employing systolic arrays of parallel processors, where the code words are of fixed length and indicate the length and starting point of the code.

U.S. Pat. No. 5,226,119 which concerns the use of a barrel shift circuit in connection with a graphic display controller.

U.S. Pat. No. 5,243,341 which concerns a Lempel-Ziv compression scheme with enhanced adaptation, and employing two dictionaries, the second being used as a standby when the first is being reset.

U.S. Pat. No. 5,247,638 which concerns an apparatus for compressing data in a dynamically mapped virtual data storage system.

U.S. Pat. No. 5,262,776 which concerns a Lempel-Ziv algorithm for data compression of partial sequences of a data sequence, and in particular, a technique to generate a primary sequence from coefficients of a discrete cosine transform of image values of picture elements of a reproduced image.

Generally, in connection with systems based on the Lempel-Ziv algorithm, the decompression of the compressed data in order to extract the transmitted information accurately and completely encounters similar difficulties in connection with the complexity of the circuitry, chip area and power required.

Patents which concern the decoding of data encoded by the Lempel-Ziv algorithm include the following:

U.S. Pat. No. 5,058,137 which is directed to a Lempel-Ziv decoder; and

U.S. Pat. No. 5,245,338 which is directed to a high speed variable length decoder for the Lempel-Ziv encoded data which uses a barrel shifter circuit.

SUMMARY OF THE INVENTION

An object of the present invention is to provide high speed data decompression for information that has been subject to a Lempel-Ziv-type compression algorithm.

It is another object of the present invention to provide for high speed data decompression in a system using a Lempel-Ziv-type algorithm which encodes data using code length and address information, particularly a system wherein there are a predetermined number of code length values used to encode data.

It is yet another object of the present invention to provide a method and apparatus for high speed decompression of information encoded by a Lempel-Ziv-type algorithm wherein all possible code length values are identified concurrently and used in a parallel determination of the decompressed data.

It is yet another object of the present invention to provide a method and apparatus for processing variable length data items in a data compression system wherein code items are transmitted in variable lengths together with corresponding variable length code information and are received and stored in a memory having plural addresses, the method and apparatus further involving the decoding of code bits corresponding to the length of each code item to identify its actual length and for adding all of the variable length possibilities of a first code item to the starting address of the first code item for a parallel determination of the starting address of a subsequent code item.

BRIEF DESCRIPTION OF THE DRAWINGS

FIGS. 1A–1C are diagrams of a conventional Lempel-Ziv technique for compressing data using a relative addressing scheme.

FIGS. 2 and 3 are illustrations of various system configurations utilizing a fixed addressing scheme.

FIG. 4A is an example of the Lempel-Ziv code data for a 2K RAM, FIG. 4B is an example of coding each letter of a text sequence and FIG. 4C is an example of the coded sequence as stored.

FIGS. 7A is a block diagram of a state machine for generating register loading information and FIG. 7B illustrates a timing circuit.

FIG. 8 is a flow chart for a serial decompression process.

FIGS. 9A and 9b are a level diagram of the barrel shifting operation using a parallel decompression technique and a flow chart for parallel decompression, respectively.

FIGS. 10A and 10B illustrate a decoder arrangement and a history buffer structure, respectfully, relevant to the present invention.

DESCRIPTION OF PREFERRED EMBODIMENTS

The Compression/Decompression System Structure

Figure 2:
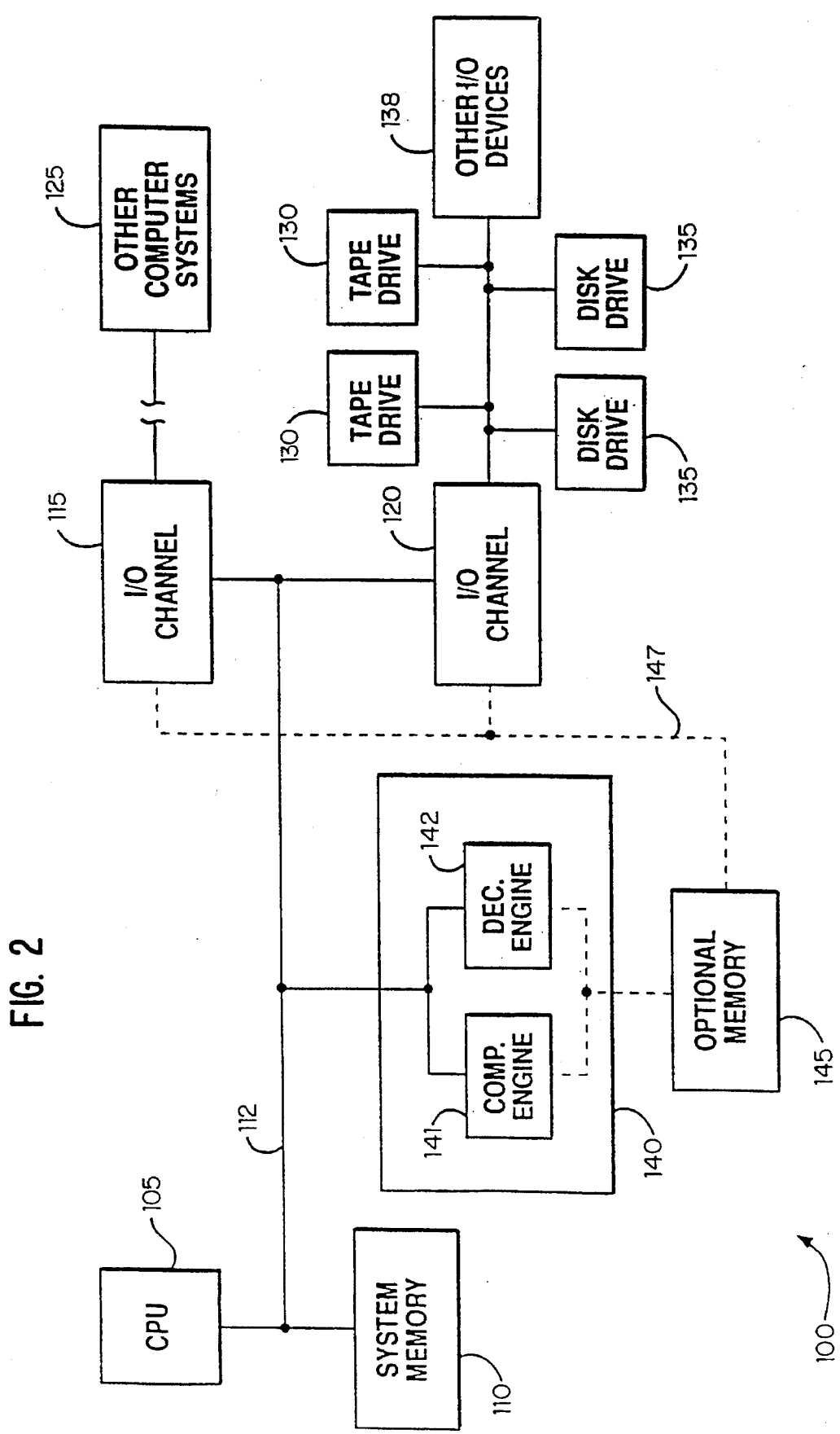

There are several system designs that can use a Lempel-Ziv-type algorithm for data compression and decompression. FIGS. 2 and 3 are illustrations of various system configurations which achieve data compression using fixed and relative addressing schemes. As shown in FIG. 2, a computer 100 includes a central processing unit (CPU) 105 that communicates with system memory 110. The CPU also communicates on bus 112 with input/output channels or adapters 115 and 120. Through the input/output channels, the CPU many communicate with other computer systems 125, tape drives 130, disk drives 135, or other input/output devices 138 such as optical disks. Computer 100 may also include a compression/decompression engine 140 on bus 112. The compression/decompression engine includes compression engine 141 and decompression engine 142. These engines may be invoked by an operating system file handler running on the CPU to do compression or decompression of data being transmitted or received through the input/output channels. The engines may utilize system memory 110 or an optional memory 145 while performing the desired compression or decompression of data. If optional memory 145 is used, the compressed or decompressed data may be transmitted directly to and from the I/O channels on optional bus 147.

FIG. 3 illustrates a computer 150 including a CPU 155 and system memory 160. The CPU communicates on bus 162 with input/output channels or adapters 165 and 170. Through the input/output channels, the CPU may communicate with other computer systems 175, tape drives 180, disk drives 185 or other input/output devices 188. Coupled to the input/output channels are compression/decompression engines 190 and 194 for compressing and decompressing some or all data passing through the input/output channels. The compression/decompression engines include compression engines 191, 195 and decompression engines 192, 196. The engines may also have optional memories 198 and 199 for working as buffers and for handling space management tasks as the data is compressed or decompressed.

There are many other alternative system configurations that may use the relative addressing technique. For example, one computer system, such as a server, may include a data compression engine for compressing all data sent to it while the remaining computer systems may each include a decompression engine to decompress all data they receive from the server.

The Compression Techniques

As previously explained, a hardware implementation of the Lempel-Ziv technique discussed above with respect to FIGS. 1A–1C uses a relative addressing scheme.

Another Lempel-Ziv-type compression scheme uses fixed addresses. A fixed addressing scheme allows the stored previously processed data to remain in a fixed location in memory. This permits a very simple, fast hardware encoder and decoder implementation with decreased search overhead requirements for each word operation while performing an exhaustive string matching process. One clear advantage of using a fixed address to store data words is that the data words do not need to be shifted from register to register, which could require additional circuitry.

When using the Lempel-Ziv-based method proposed by Craft in the referenced application (referred to as a "LZ1" type algorithm), a start address and length of the matching string can be calculated, encoded and generated as a token. For example, a raw word token is generated as a O followed by the raw word. A compressed word token is passed as a 1 followed by a binary identification of the length of the matching string and a series of bits identifying the starting location of the matching string in a memory array (called the displacement). A control token may also be generated which starts with either 1's and is followed with four bits designating the control instructions. Finally, an end token is passed to designate the end of a compressed data stream. The end token is thirteen 1's in a row.

Table 1 shows the codes used to designate the length of a compressed data word string. This type of coding is a modified logarithmic coding wherein shorter strings utilize shorter codes and longer strings utilize longer codes. This is a useful coding technique when the frequency of shorter strings is substantially greater than the frequency of longer strings. The displacement is specified with an 11 bit value in an embodiment where the memory array has a 2K size. A shorter displacement may be used with a memory array having fewer sections and a smaller size, e.g., 1K or 512 size. In the following table, it should be noted that there are five groups of possible code lengths, each group comprising 2, 4, 6, 8 or 12 bits.

TABLE 1

Codes Used to Designate Compressed Word Length

| Code Field | | | Compressed Word Length |
|---|---|---|---|
| 00 | | | 2 words |
| 01 | | | 3 words |
| 10 | 00 | | 4 words |
| 10 | 01 | | 5 words |
| 10 | 10 | | 6 words |
| 10 | 11 | | 7 words |
| 110 | 000 | | 8 words |
| ... | ... | | ...... |
| ... | ... | | ...... |
| 110 | 111 | | 15 words |
| 1110 | 0000 | | 16 words |
| ... | ... | | ...... |
| ... | ... | | ...... |
| 1110 | 1111 | | 31 words |
| 1111 | 0000 | | 32 words |
| ... | ... | ... | ...... |
| ... | ... | ... | ...... |
| 1111 | 1110 | 1111 | 271 words |

An overview of how the above compression algorithm works can be provided by a simple example involving the compression of the phrase: "the boy the dog". As already explained, the above LZ1 algorithm compresses data by looking for repeated sequences of characters in the data stream. For example in the phrase "the boy the dog" the word "the" repeats itself in the sentence and therefore can be compressed. The compression would be accomplished by using the following series of steps:

First, the phrase is stored in a RAM (one 8-bit ASCII character per address), commonly called a HISTORY RAM, which may be of any size but in a preferred embodiment may have a capacity of 2K, 1K, or bytes.

| Address | data |
|---|---|
| 00 | t |
| 01 | h |
| 02 | e |
| 03 | |
| 04 | b |
| 05 | o |
| 06 | y |
| 07 | |
| 08 | t<=== |
| 09 | h<=== repeated string of characters |
| 10 | e<=== |
| 11 | <=== |
| 12 | d |
| 13 | o |
| 14 | g |

Second, the repeated string of characters is identified, as shown above.

Third, the starting address of the first instance of the repeated string, called the "displacement" (here displacement=00), is recorded.

Fourth, the "length" of the repeated data string (here the data length=04) also is recorded.

Fifth, the non-repeated characters (i.e. "raw" data) are output as is, but only displacement and data length is output for the entire repeated character string. In the present example, the output for this compressed sentence would be:

| | data |
|---|---|
| Byte 1 | t |
| 2 | h |
| 3 | e |
| 4 | |
| 5 | b |
| 6 | o |
| 7 | y |
| 8 | |
| 9 | length = 04, displacement = 00 |
| 10 | d |
| 11 | o |
| 12 | g |

In the preceding example, it is assumed that one can output the "d" (displacement) and "L" (data length) value in one single byte, which is not very practical. Also there would be a problem because a "marker" is needed to tell the decompression algorithm whether a byte of data is "raw" (uncompressed) or compressed. Without a marker the "L" and "d" value will look like any other ASCII code and the decompression algorithm will not be able to function.

In order to avoid these problems, the LZ1 compressed data is coded according to a scheme outlined above and also the industry standard published by Quarter-inch Cartridge Drive Standards, Inc. in their QIC Development Standard entitled "Adaptive Lossless Data Compression (ADLC)"; WIC-154 Rev. A, (10 Mar. 1994). A simplified description of the code is given below with reference to FIGS. 4A–4C.

FIG. 4A shows the six cases of data that can occur in the above described encoding scheme. Case 1 is for "raw" (uncompressed) data, and cases 2 through 6 are for different lengths of compressed data. By using different size compressed word tokens for compressed data, the length of the compressed data is reduced, thus increasing the compression effect. In this regard, the "code length" is the number of bits in a code token (e.g. 9-bits for a raw token) while the "data length" is the number of bytes that the compressed code token will produce after it is decompressed (e.g. the length of the compressed code token for "the" in "the boy and dog" is 4).

In the LZ1 algorithm data arrangement, the first bit is a "coded bit". For example, as illustrated in FIG. 4A, the first bit of the code token is a "0" only if the code word has a raw byte. This bit is added to the existing 8-bits of the raw word (shown as b's in FIG. 4A) to make one 9-bit raw token. This first bit tells that the 8 bits following are raw data. Where there is a compressed word token, the "coded bit" is a "1", which means that the following data is compressed.

The rest of the coded data in FIG. 4A are compressed word tokens of differing lengths. Where there is a "1" as the coded bit, the next bits prior to the appearance of a "0" will indicate how many length bits ("L") will follow ("0" alone indicates one "L" bit, "0" proceeded by two "1"'s indicate three "L" bits, etc. The value of "L" is 0 or 1 depending on the length. The value of "d" contains the displacement address. In the data shown in FIG. 6A, eleven "d" bits are shown. These 11 "d"s are the displacement addresses in a 2K BYTE HISTORY RAM. For a 1K or 512 byte HISTORY RAM, 10 or 9 "d" bits are used, respectively.

From FIG. 4A it is apparent that by looking at the first five bits of a token, it can be determined whether the code word is case 1–6. This, combined with knowing the history RAM size (2K, 1K or 512) allows the code length to be decoded. Table 2 below summarizes how to decode code length based on the preferred HISTORY Ram sizes, because it lists the code length for 2K, 1K, and 512 HISTORY RAM sizes.

TABLE 2

| | Code lengths based on decoding first 5 bits of code word | | | |
|---|---|---|---|---|
| CASE | FIVEBITS | SIZE2K | SIZE1K | SIZE512 |
| 1 | 0**** | 9 bits | 9 bits | 9 bits |
| 2 | 10*** | 14 | 13 | 12 |
| 3 | 110** | 16 | 15 | 14 |
| 4 | 1110* | 18 | 17 | 16 |
| 5 | 11110 | 20 | 19 | 18 |
| 6 | 11111 | 24 | 23 | 22 |

There are two additional LZ1 code types not shown in FIG. 4A. As previously noted, these two codes are called END MARKER and CONTROL CODE, both being special case 6 codes. END MARKER is used to mark the end of the compressed data transmission (e.g. it is the last code word sent to the decompressor). CONTROL CODE comprises special reserved case 6 codes set aside for other uses not pertinent to the present invention.

Using FIG. 4A as a guide, the actual compressed data expected out of the above LZ1 algorithm for the phrase "the boy the dog" is seen in FIG. 4B. Note that for convenience and clarity the actual ASCII codes for each character are not shown. Instead, either "b's" have been listed to represent the real ASCII value.

In the example of FIG. 4B, the total number of bits in the compressed data is 115. Divided by 8 this yields 14,375 bytes, so compression is very slight when compared to the 15 bytes needed to store "the boy the dog" in uncompressed form. However, under actual operating conditions, the compression ratio can be much higher, on the order of two to three times.

While the above referenced Craft application teaches one design for implementing the LZ1 algorithm, there are a variety of system architectures that can implement the LZ1 coding technique based on the above description. For purposes of understanding the decompression features of the invention as subsequently described, the basic principles of the encoding technique and the structure of the transmitted data would be sufficient to implement the decompression apparatus.

The Decompression Techniques

The decompression scheme is directly related to the characteristics of the compression scheme as previously described. One fundamental requirement is to look at the first bit of every code token. If this bit is "0", then the code token is a raw token and the 8 bits that follow are the actual uncoded data. These 8 uncoded bits are stacked into a HISTORY RAM and outputted directly as decompressed data. The bits are stored in a HISTORY RAM because they may be needed by some future compressed code words (In "the boy the dog" example above, the first "the" is stored as raw data. The second "the" is stored as compressed data and references the first "the" starting at address 0 in the HISTORY RAM).

If the first bit of the code token is "1", then the token is a compressed word token and the decompressor reads out starting at HISTORY Ram address "dddddddddd". The decompressor continues to read bytes from the HISTORY RAM at addresses incrementing up from address "dddddddddd". It does this for the number of bytes specified by the data length value of the compressed word token. The decompressor outputs the data it reads out from the HISTORY RAM because this is the already decompressed data. It also continues to stack this data into the HISTORY RAM in case it is needed for some future compressed code words. (For example if you compressed the sentence "the boy the dog the boy the dog", the first "the" would be stored raw, the second "the" would be stored as a compressed word token (L=4, d=0), then the entire second occurrence of "the boy the dog" would be stored as one big compressed word token (L=15, d=0). This shows the recursive power of the compression technique and highlights the need to stack all decompressed data, not just raw bytes, into the HISTORY RAM.

A further basic requirement is to determine where the code tokens start and where they end. This is difficult because of the variable length (9 to 24 bits) for the six different cases of compressed word tokens. FIG. 4C shows the compressed output from "the boy the dog" example, this time outputting the data in 16-bit words. As seen in FIG. 4C, the code tokens can start and end anywhere in the 16-bit stream. In FIG. 4C, one can visually determine where the code tokens start and end because the code tokens use b's, L's and d's rather than real 1's and 0's. If the b's, L's and d's were turned into 1's and 0's, as is actually the case, it would not be possible to visually inspect the data to determine where one code token ends and another begins.

Moreover, from the illustration of FIG. 4C, it is clear that the code tokens are not organized on byte boundaries. The code data must be separated into individual code tokens by decoding the actual length of the current code tokens to find the next code token.

The decompressor keeps track of where the code tokens start and end by decoding the length of the code token ("code length") and adding this code length to the position of the current code token. For example, the first code token starts at position 0 in the 16-bit data stream. The first code token is a raw byte so the code length=9. Therefore, the next code word (the 2nd) starts at position 9 in the 16-bit stream.

The second code token begins at position 9 and is also a raw byte with code length=9. Therefore the next code token (the 3rd) starts at position 18 in the 16-bit stream. Since there is no 18th position, the decoder skips down to the next 16-bit word at looks at position 2 because this is the 9th bit from the start of the code token.

The decompressor continues in this manner, always finding where the next code token starts by adding the code length to the current code token starting address. Mathematically this is:

$$\begin{bmatrix} \text{NEXT CODE WORD} \\ \text{START ADDRESS} \\ \text{(NEXT ADDRESS)} \end{bmatrix} = \begin{bmatrix} \text{CURRENT CODE WORD} \\ \text{START ADDRESS} \\ \text{(CURRENT ADDRESS)} \end{bmatrix} + \begin{bmatrix} \text{CODE LENGTH OF} \\ \text{CURRENT CODE WORD} \\ \text{(CODE LENGTH)} \end{bmatrix}$$

Significantly, this is a serial operation and, a determination of where the next code token is stored cannot be made until the above formula for the current code word is completed.

Figure 5:
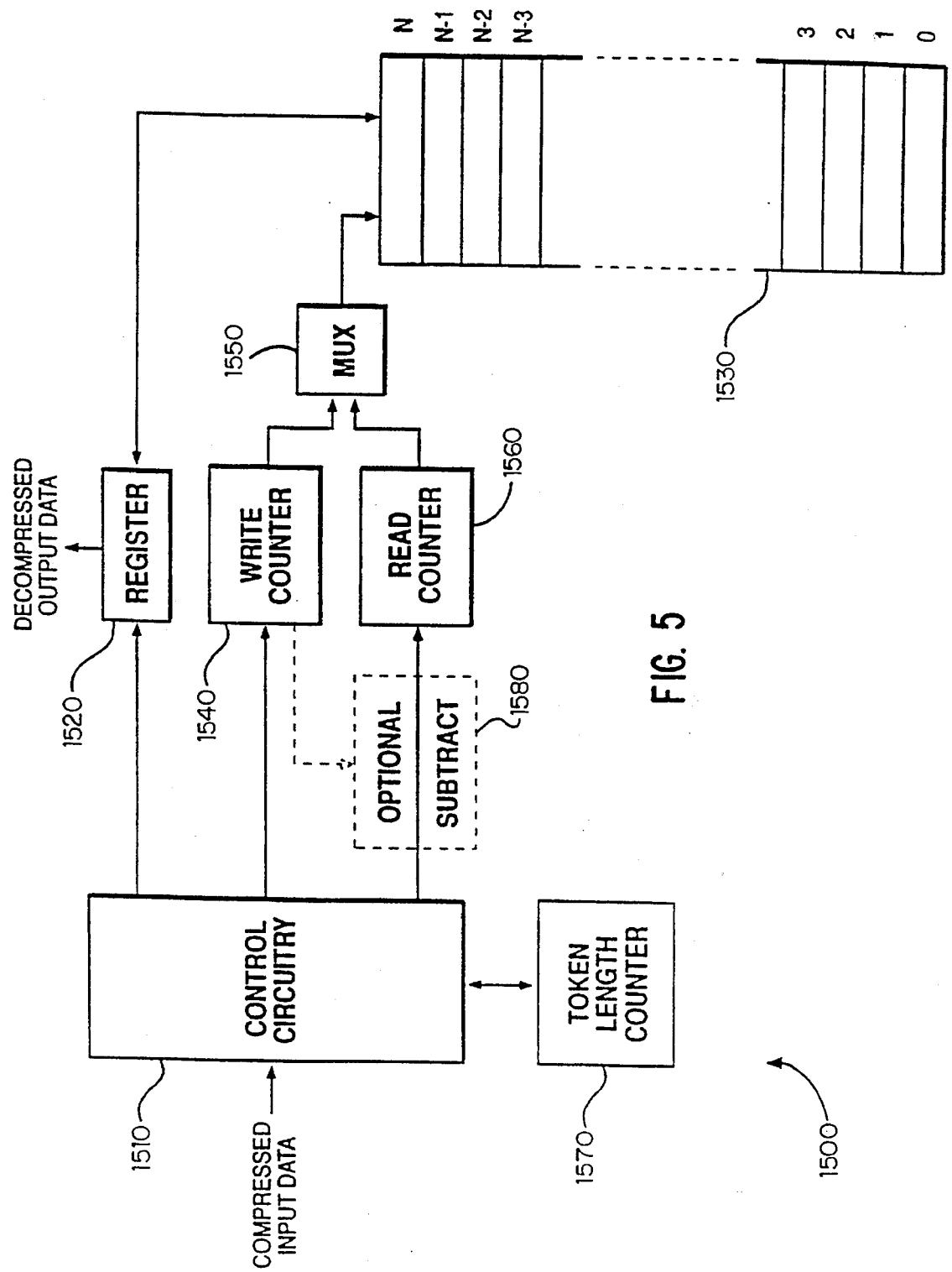
FIG. 5 is a block diagram illustrating a decompression engine.

FIG. 5 is a high level diagram of a decompression engine 1500 that shows in simple form how data generated by the compression engines seen in FIGS. 2 and 3 can be decompressed. Control circuitry 1510 receive the compressed data stream including raw tokens (a data word preceded by a 0), compressed word tokens (a 1 followed by a length of a string and a start address), control token and an end marker token (e.g. 13 1's in a row).

If a raw token is received, the enclosed data word is stored in register 1520. The contents of the register are then written to a HISTORY RAM 1530 (with the same number of sections as a HISTORY RAM used to compress the data) at the address in a write counter 1540 (initially set to O) through address multiplexer 1550. In addition, the content of the register is also generated as an output data word. The write counter is then incremented by one. If the write counter is already at N, then it is set to O. As a result of this operation, each data word is written to the next subsequent section in the HISTORY RAM, thereby mirroring a HISTORY RAM used during data compression, and the data word is also generated as an output.

If a compressed word token is received, the address is loaded into a read counter 1560 and the length is loaded into token length counter 1570. The data in the HISTORY RAM is addressed by the read counter through multiplexer 1550 and is then read into register 1520. That data word is then written to the HISTORY RAM at the address in the write counter to continue the mirroring of the HISTORY RAM used to compress the data. The data word in the register is also generated as an output data word. The write counter is then incremented by one as described above. If the token length counter is greater than one, then is it decremented by one, the read counter is incremented by one, and the process repeats for the next data word. This process repeats until the whole data string referred to by the compressed data string has been sequentially read from the HISTORY RAM, written back into the HISTORY RAM, and generated as an output.

An optional subtract unit 1580 may be included to allow this decompression engine to decompress Lempel-Ziv compressed data that utilizes relational addresses as described in FIGS. 1A–1C. This subtract circuit would be used to convert the relational address to a fixed address by subtracting the value in the write counter from the relational address. The subtract circuit could also be included but disabled when decompressing data compressed by the fixed address technique described above and enabled when decompressing Lempel-Ziv compressed data using relational addresses.

As previously noted, the decompression technique can be conducted on the basis of a serial decoding of each code word. Because the above LZ1 data compression code is a semi-logarithmic, variable length code and code words can range in length from 9 to 24 bits and the code data is not organized based on fixed byte boundaries, high speed barrel shifting must be performed to line up each discrete code word for further processing. One key requirement is that the current address must be found and must be updated to the next address value to find the next code word. A second key requirement is that the LZ1 decoder must separate the code words, producing a sequence of "left justified" code words:

| codeword # | Left justified codeword |
| --- | --- |
| 1 | <—1— |
| 2 | <—2— |
| 3 | <—3— |
| 4 | <—4— |
| . | . |
| . | . |

A barrel shifter is used to perform this separation and left-justify the code words.

Figure 6:
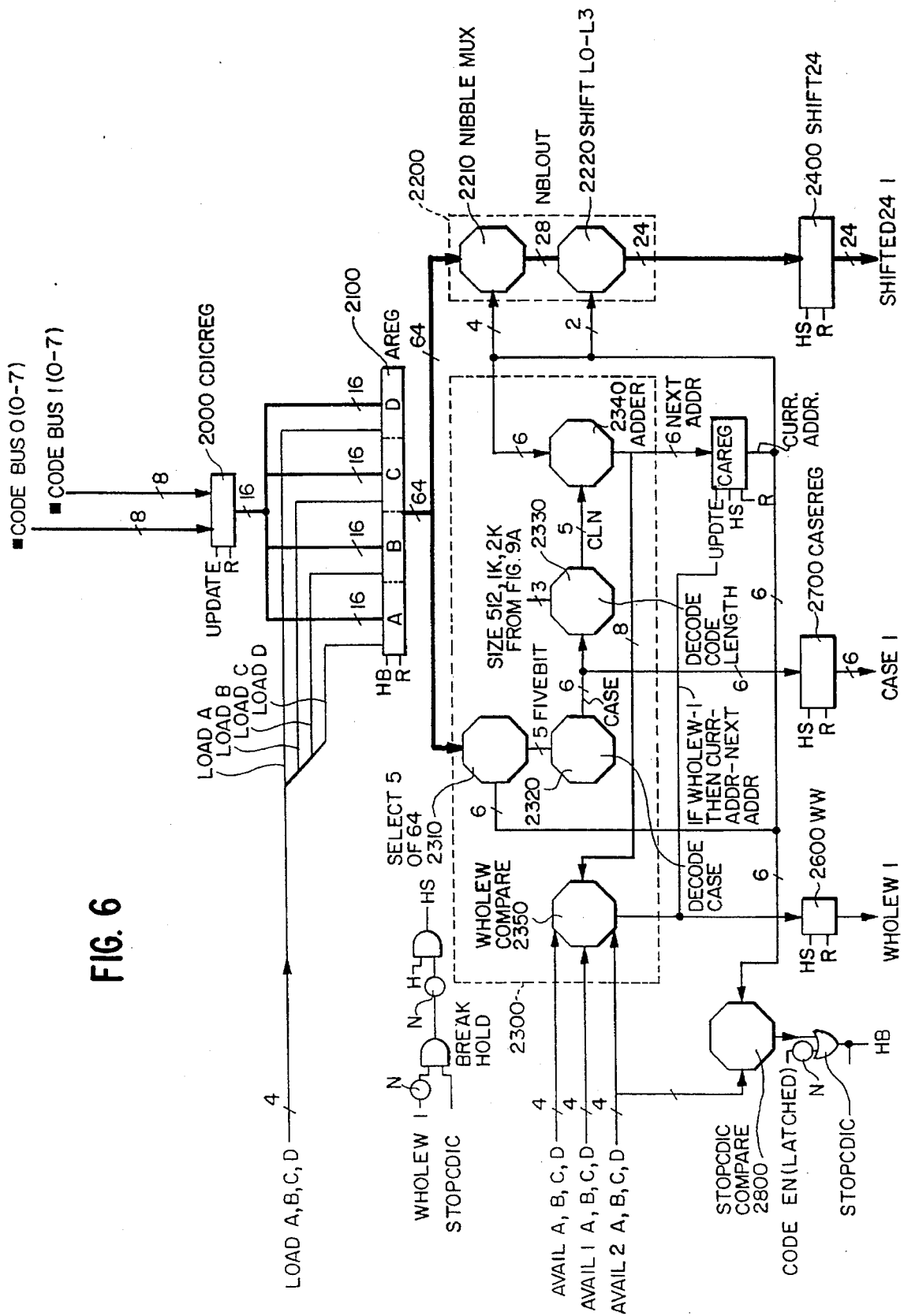
FIG. 6 is a level diagram of the barrel shifting operation used in the decompression engine.

An approach to conducting this operation is seen in FIG. 6. Compressed code is brought into a large collection register (AREG) 2100 in conveniently sized segments. A large collection register (AREG) is preferred in order to simplify the barrel shifting operation, because the entire code word is available before shifting occurs. FIG. 6 shows 16-bit code data received on two code buses (CODE BUS 0 and CODE BUS 1). The code data comes in via a handshake protocol 16-bits at a time and is loaded into a 16-bit register (CDICREG) 2000. This data is then loaded into the 64-bit AREG register 2100 that has been divided into 4 segments A, B, C, and D, each comprising 16-bits. The 16-bit code is loaded into a selected one of the four segments A, B, C or D. The AREG register 2100 has a first reset input R and a second input HB, whose generation is described subsequently. Other architectures (e.g., using 8-bit segments) also are possible but the AREG should be large enough so that each individual code word will be entirely contained in the AREG at one time. The AREG is loaded with compressed data in the segment sequence A, B, C, D, A, B, C, D, A . . . . The storage location in the AREG for the 16-bit code from the register 2100 is determined by the content of the signals on the LOAD A, B, C, D lines, which are connected to respective register segments.

Figure 7A:
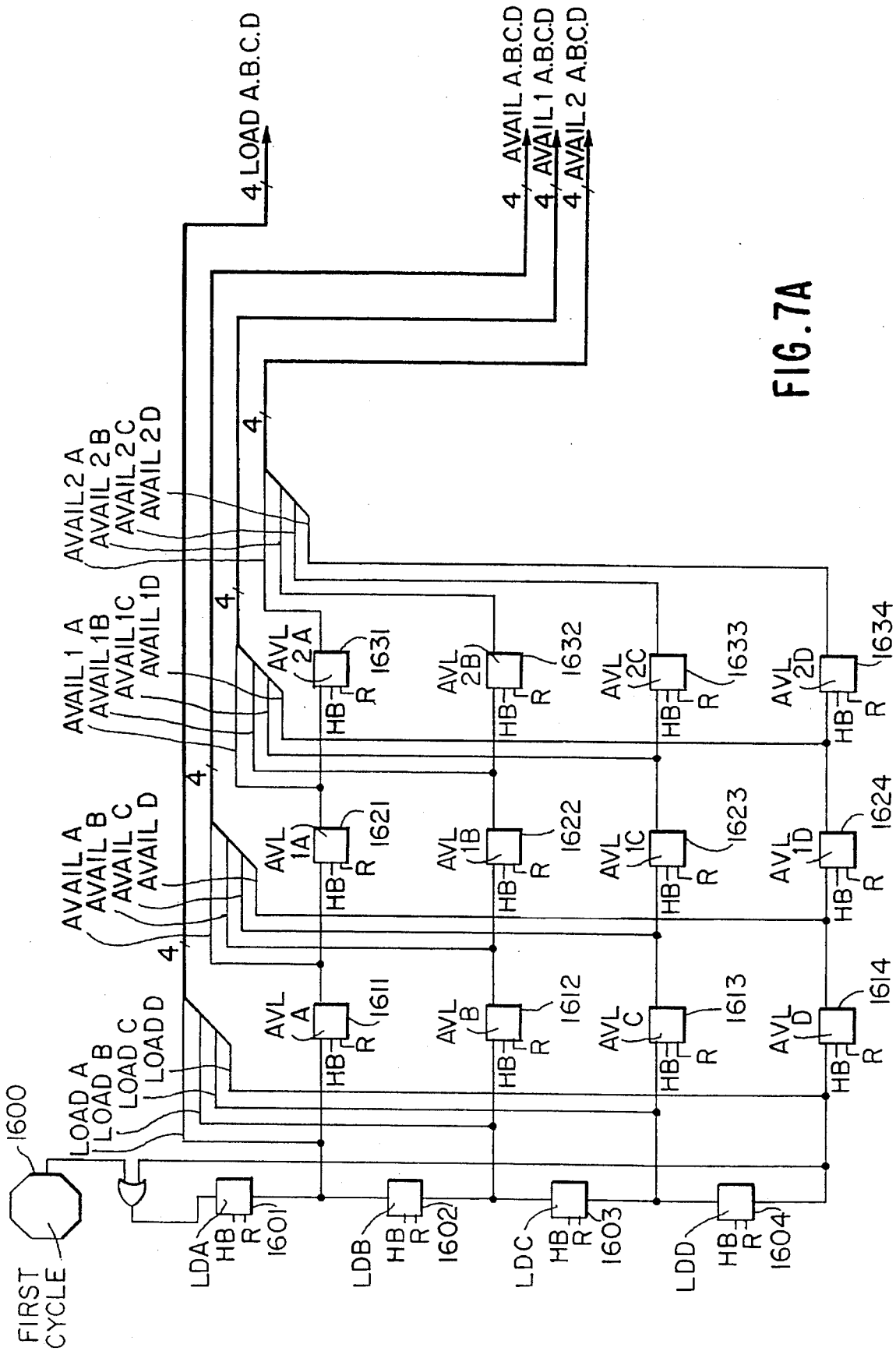

First, it should be noted that FIG. 7A is a state machine that controls how the AREG is loaded with code data. The state machine is initialized by logic FIRST CYCLE 1600 and comprises a matrix of four groups of latches: LDA-LDD, 1604-4; AVLA-AVLD, 1611-14; AVL1A-AVL1D, 1621-24; and AVL2A-AVL2D, 1631-34. The main output of the state machine comprises the signals LOAD A, LOAD B, LOAD C and LOAD D. The first cycle LOAD A is active, then the next cycle LOAD B is active . . . and finally LOAD D is active, followed again by LOAD A. The state machine is reset whenever R is active and is held whenever HS is active, as explained subsequently. The remaining outputs are simply delays of LOAD A, B, C and D signals. These delayed values tell whether a segment of the accumulation register has been loaded with data in the current cycle (AVAIL), in the cycle one behind (AVAIL1) or in the cycle two behind (AVAIL2). For example, if LOAD A is active in cycle 1, AVAIL A will be active in cycle 2, AVAIL1 A will be active in cycle 3 and AVAIL2 will be active in cycle 4.

In the discussion that follows, CURRENT ADDRESS and NEXT ADDRESS are bit locations in the AREG. For example, the 64-bit AREG shown in FIG. 6 has bit locations 0–63. Bit-0 is defined as the most significant bit (MSB), and bit-63 is the least significant bit (LSB). CURRENT ADDRESS defines the start of the code word and CODE LENGTH specifies the length of the entire word from the CURRENT ADDRESS to the NEXT ADDRESS. For example, CURRENT ADDRESS 0 means the current code word starts at AREG bit-0 and continues to the NEXT ADDRESS-1.

The code in AREG is read out to both a barrel shifter 2200, comprising nibble MUX 2210 and shifter 2220, and a NEXT ADDRESS circuit 2300. In the barrel shifter 2200, since four bits are a nibble, seven consecutive groups of 4 bits are selected from the AREG 2100. This technique is used to "left-justify" the code words being shifted out of the AREG 2100. The shift logic 2200 then shifts the code word zero to three values to the left (i.e., the 28 NBLOUT bits are shifted 0–3 values), forming the SHIFT24 value.

The NEXT ADDRESS circuit 2300 includes a selector circuit 2310, which selects the first five bits in a row from the code stored in AREG 2100. As previously noted, the first five bits contain information as to the nature of the information ("0" in the first bit portion means uncoded and "1" means coded) and length of the code. For the preferred embodiment, there are six possible code length cases and the particular one of the six cases is determined by decoding logic circuit 2320. The identified case is stored in the CASEREG register 2500 and is used to decode the code length in circuit 2330, together with information as to the size of the RAM (512, 1K or 2K). The identified code length is sent to an adder 2340, which also receives the CURRENT ADDRESS and outputs a NEXT ADDRESS value for use in determining if that value is correct. The adder 2340 is a six bit carry assume binary adder which need not include carry-in or carry-out.

Two control loops are used to control the AREG. The first loop called "STOPCDIC" controls the loading of data into the AREG. STOPCDIC monitors the CURRENT ADDRESS. The STOPCDIC loop will generate a control output when the AREG segment that has just been loaded is two register segments ahead of the CURRENT ADDRESS (although it also could be set to occur when the AREG segment that has just been loaded is three register segments ahead of the CURRENT ADDRESS). The determination of the two-segment lead is made by a comparison of the CURRENT ADDRESS value from register 2500 with the AVAIL2 A,B,C, and D inputs to comparator 2800. The output of the comparator 2800 in the event of a successful comparison results in signal HB, which is an input to the AREG 2100. The purpose of the STOPCDIC loop is to keep the AREG loaded with new data, while preventing the AREG from being overloaded. The STOPCDIC loop causes the AREG, when loaded, to wait for data to be unloaded by the barrel shifting operation.

The second control loop is identified by the acronym "WHOLEW", and involves logic indicating that a "whole code word" has been identified. The WHOLEW indication occurs whenever the entire current code token is available in the AREG. WHOLEW is determined by comparing the NEXT ADDRESS with the available AREG segments. This comparison is conducted in comparator 2350, which receives 4 bits of information for three cases of available code (A, B, C, D) and the output NEXT ADDRESS from adder 2340. When the NEXT ADDRESS is in an available AREG segment, WHOLEW="1". Whenever WHOLEW is true, an output is provided by comparator 2350 to register 2600 as well as to register 2500 for storing the NEXT ADDRESS from adder 2340 as the CURRENT ADDRESS. The new CURRENT ADDRESS is then used as an input to the barrel shifter 2200 and the selector 2310.

When the entire code word is available in the AREG, the WHOLEW detection circuit is triggered, and the output code word is shifted to be "left justified", then stored in the 24-bit wide SHIFT24 register 2400. Also stored in CASE register 2700 are six CASE 1 bits and in latch 2700 the signal indicating WHOLEW 1. The WHOLEW 1 signal serves as a "data valid" signal for the SHIFT24 register. The six CASE 1 bits tell which one of the six types of LZ1 code words is available in the SHIFT24 register 2400.

WHOLEW is detected by comparing in logic 2350 whichever segments (A, B, C, D) are available in the AREG with whatever AREG segment the NEXT ADDRESS falls in. When the NEXT ADDRESS is in an AREG segment that has available data, WHOLEW=1. The NEXT ADDRESS is compared to AVAIL, AVAIL1 and AVAIL2. These represent AREG segments just loaded, loaded one cycle previous, and loaded two cycles previous. If the NEXT ADDRESS is in one of the AVAIL, AVAIL1 or AVAIL2 registers then WHOLEW=1.

The AREG is loaded until it is two segments ahead of the CURRENT ADDRESS. When the AREG segment that the CURRENT ADDRESS falls into equals the AVAIL2 segment, STOPCDIC occurs. As seen in FIG. 6, STOPCDIC "OR's" with "NOT" code EN (enable) to form HB, which holds the AREG loading and the code data interface.

The outputs of the two loops are joined as seen in FIG. 7B. There, WHOLEW 1 (inverted) and STOPCDIC are provided to a BREAK HOLD gate. That gate output is inverted and provided via a second gate, also receiving signal H (hold), and results in the generation of signal HS. HS serves as an input to several registers, including 2500, 2600 and 2700.

For a first case, the SHIFT24-1, CASE-1 and WHOLEW-1 values get held by input HS while signals are being decompressed (note the suffix "-1" refers to a pipeline stage). This hold is necessary because a new shifted code word is not needed while a large code word is decompressing. The signal HS is the same as the signal H except HS=0 when STOPCDIC=1 while WHOLEW-1=0. This special case is necessary to avoid a "dead cycle" e.g., WHOLEW 1=0 after a large code word (e.g., 24 bits) is pulled from the AREG into the SHIFT24-1 register. Specifically, once STOPCDIC=1 there must be enough data in the AREG to guarantee that a WHOLEW is available so the hold is broken for this special case.

In operation, the barrel shifter 2200 takes the AREG register bits starting at the CURRENT ADDRESS and loads the entire code word into the SHIFT24 register 2400. Table 3 identifies which bits the barrel shifter loads into the SHIFT24 register based on the CURRENT ADDRESS. This code word is left-justified when stored in the SHIFT24 register 2400, in the arrangement of FIG. 8A. As previously noted, WHOLEW serves as a "data valid" signal for the SHIFT24 data.

TABLE 3

Selecting 24 of 64 AREG bits based on CURRENT ADDRESS

| CURRENT ADDRESS | SHIFT24 | |
|---|---|---|
| | (MSB) | LSB) |
| 0 | AREG 0–23 | |
| 1 | AREG 1–24 | |
| 2 | AREG 2–25 | |
| . | . | |
| . | . | |
| 40 | AREG 40–63 | |
| 41 | AREG 41–63, 00 | |
| 42 | AREG 42–63, 00, 01 | |
| . | . | |
| . | . | |
| 62 | AREG 62–63, 00–21 | |
| 63 | AREG 63, 00–22 | |

FIG. 8 shows the five steps needed to determine whether WHOLEW=1 when using the 64-bit AREG architecture. In a first step S-81, the first five bits of the code word are selected. Then, based on the encoded information in those five bits, a determination is made in step S-82 as to which of cases 1–6 are represented; it should be noted that there are six possible code lengths in the above example representing a decompressed length of up to 271 bytes. Next, based on the identified case, the code length is determined in step S-83. This code length is added to the current address in step S-84 to determine the NEXT ADDRESS. Finally, in step S-85, a comparison of the NEXT ADDRESS and an available AREG segment is made to determine whether WHOLEW is equal to 1, signifying an identity of those values.

There are advantages to using the two control loops in the manner described. First, control of the loading of the AREG is independent of the AREG unload control. This allows AREG loading to continue even while the AREG unloading mechanism is "held" due to latter pipeline logic stages not being ready for new shifted code words. This causes the AREG to act as storage, assuring that there is always a new code word ready to be unloaded by the barrel shifter whenever needed.

Second, with respect to controlling the loading of the AREG based on CURRENT ADDRESS with the STOPCDIC control loop, timing is improved because CURRENT ADDRESS is available immediately. There is no need to wait for an addition as there is with the NEXT ADDRESS. Also, the CURRENT ADDRESS is not affected by the length of the code word as is the NEXT ADDRESS. CURRENT ADDRESS acts the same for all six cases of code words. Finally, CURRENT ADDRESS is the least significant address containing data still needed (not yet removed by the barrel shifter) in the AREG.

Third, controlling the unloading of the AREG based on NEXT ADDRESS using the WHOLEW control loop provides high accuracy since the entire code word must be available in the AREG before it is barrel shifted into the SHIFT24 register 2400. This condition is guaranteed by using the barrel shifter control loop off of NEXT ADDRESS.

Finally, the combination of the two loops provides a simple, efficient and high speed implementation of the decompression function in digital hardware.

The embodiment of the barrel shift control logic illustrated in FIG. 6 provides for a determination of WHOLEW. However, the above-described serial determination of WHOLEW can form a timing bottleneck, since it forms the slowest timing path of the decoder, thus providing a limitation on how fast the decoder can run. Specifically, the code case must first be determined before the code length is identified and only then is the NEXT ADDRESS calculated by an adder. The adder process requires a relatively large amount of processing time and results in a delay. Only after the adder process is completed can WHOLEW be determined. Because the code bit stream is continuous in the present system, and a second code token cannot be identified until the above processing is concluded based on the first code token address, a bottleneck is formed.

Figure 9A:
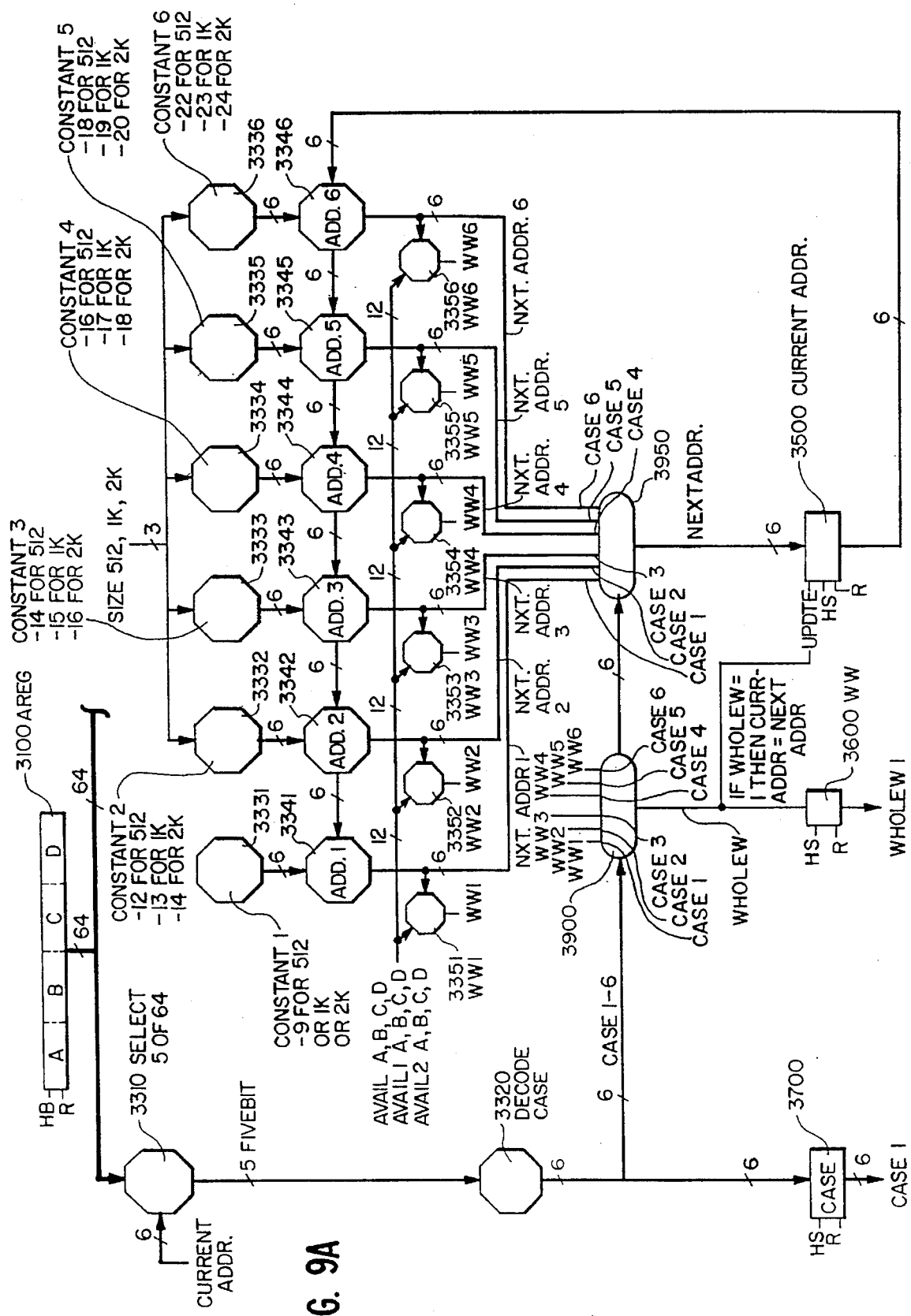

The embodiment of FIG. 9A and the accompanying method seen in FIG. 9B will speed this logic path up using parallelism.

FIG. 9A is a preferred embodiment of the decoding circuit 2300 in FIG. 8A, detailing a parallel implementation. In FIG. 9B, steps S-91 and S-92 are conducted in the same manner as the corresponding steps S-81 and 8-82 in FIG., 8. Specifically, the code data from segments A, B, C and D in the 64-bit AREG 3100 are provided to a 5-bit selector 3310 together with the CURRENT ADDRESS from register 3500 (connection not shown). The selected bits are decoded in decoder 3320 and the result stored as an identified one of six cases in register 3700.

However, in Step S-93 each possible LZ1 code length, derived from a storage (3331–3336) and depending on the applicable HISTORY RAM size (as previously noted, there are six possible lengths in the preferred embodiment based on a maximum possible byte length of 271), is added in parallel by adders 3341–3346 to the CURRENT ADDRESS from register 3500. This will create six possible NEXT ADDRESS values and will permit six possible WHOLEW determinations in step S-94 using comparators 3351–3356. As is clear from the flow chart in FIG. 9B, while these additions are being made, other logic is selecting the first five bits of the current code word (step S-91) and determining which of the six NEXT ADDRESS/WHOLEW values is the true value needed (step S-92). Two 6-to-1 multiplexers 3900 and 3950 are used to select the correct WHOLEW and NEXT ADDRESS values in step S-95.

This parallel architecture takes advantage of the fact that there are only six possible code lengths in the preferred algorithm. Because there are only six length values, the multiplexer used to select the "correct" parallel answer is very fast and the overhead to support the parallelism is not large. Parallelism speeds the decoder barrel shift control mechanism up by reducing the amount of logic decisions from a sequence of five to a sequence of three.

Clearly, this parallelism approach can be implemented for a compression system based on the LZ1 algorithm which uses other length values besides six.

In a practical embodiment of the system, timing analysis of 0.8 micron CMOS gate array silicon hardware embodying the preferred structure with six length values shows 60% speed improvement using the parallel architecture:

$$\frac{40\text{Mbyte(speed w/parallelism)} - 25\text{Mbyte(speed w/o parallelism)}}{25\text{Mbyte}} = 60\%$$

Figure 10B:
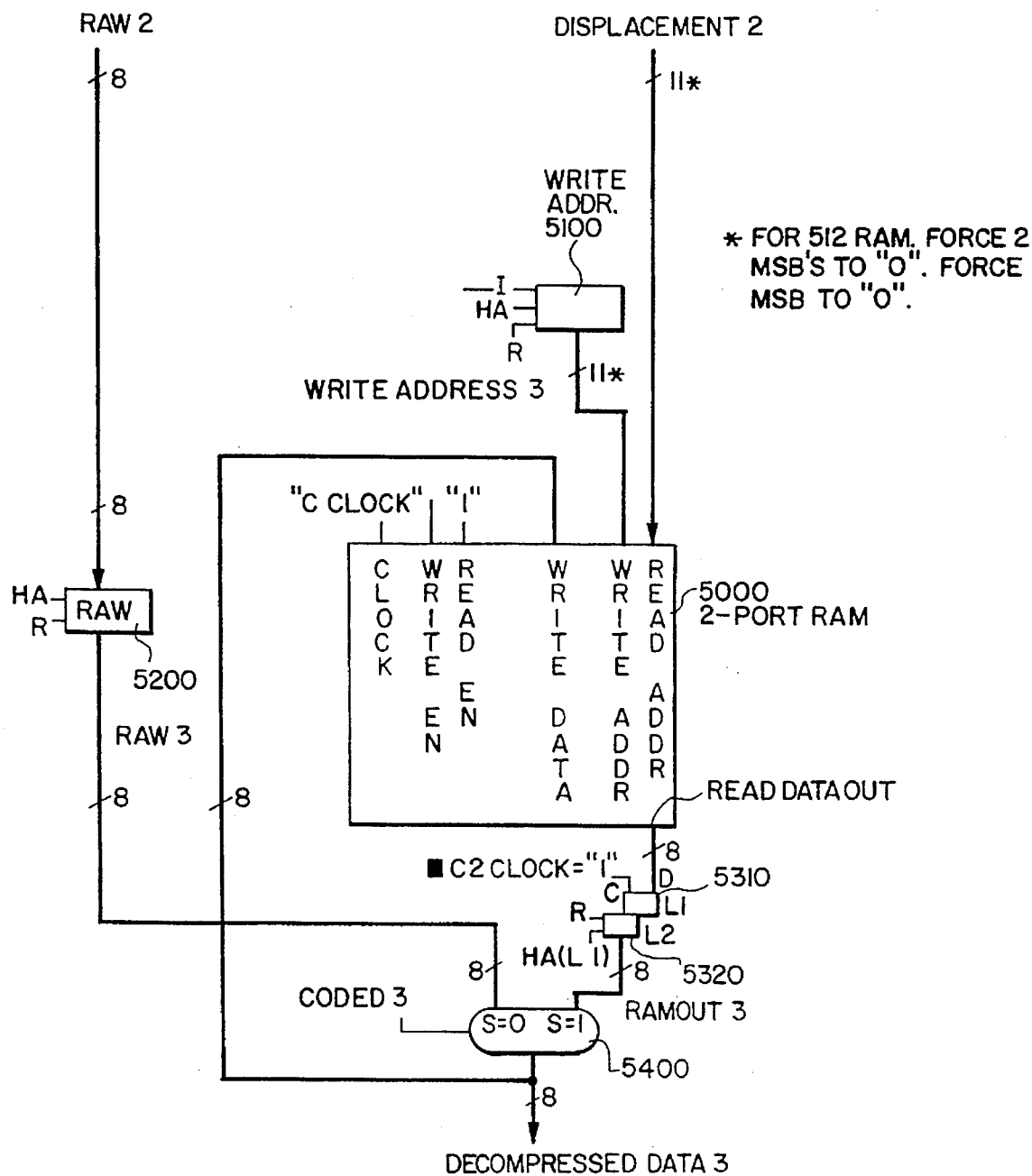

FIG. 10A is an illustration of the decode logic and the several inputs to that logic which serve as inputs to the HISTORY RAM in FIG. 10B. Specifically, FIG. 10A illustrates the logic for decoding the length, displacement and raw codes, and for generating several timing signals. As Teen in the figure, left justified SHIFT24-1 code tokens are presented to the logic circuit 4000 along with the six CASE-1 bits. The decode logic then gates the CODED, LENGTH, DISPLACEMENT and RAW values into the appropriate registers 4200, 4400, 4500, 4300. The value in the CODED register 4200 is "0" if the code token is a "raw" token and "1" if it is a compressed word token. The decode logic adjust to different code lengths caused by a HISTORY RAM in the corresponding SIZE 512, SIZE 1K and SIZE 2K values. Note that the illustrated register outputs have a "-2" suffix which indicates that the registers are at the second pipeline stage, while the major output signals in FIG. 6 were at the pipeline "-1" level.

In FIG. 10A, the hold (H) signal is generated for compressed word tokens. The H signal causes the logic in FIGS. 6 and 9A to hold until the current code word is decompressed. Based on the example given, this could take up to 271 cycles for a large code word. In operation, H is active whenever the LENGTH-2 register 4400 is not 00000000 (binary) or 000000001 (binary). Whenever a compressed word token comes into the -2 latch stage, length -2 is loaded with the compressed length value. H is set active and the LENGTH-2 begins to decrement with each clock cycle until LENGTH_2 equals 000000001 (binary), at which point H goes inactive and a new code value can be loaded into the -2 pipeline stage.

At the same time that the LENGTH-2 value is decrementing in the above example, the DISPLACEMENT-2 value is incrementing. This provides the address for th 2-port HISTORY RAM in FIG. 10B.

FIG. 10B illustrates a 2-port HISTORY RAM that operates to decompresses the coded data. When WHOLEW-_2 from FIG. 10A is active, either a whole raw token or length/displacement information is presented to the RAM from the "_2 pipeline stage. If the CODED_2 output form the decode logic 4000 in FIG. 10A is "0", the data is identified as a raw token. If so, the multiplexer 5400 selects the RAW_3 register 5200 and the decompressed data output is simply the raw data contained in the raw token. This decompressed data is then written back into the 2-port RAM 5000 via the "write data" port, becoming part of the communication "history".

If CODED__2 signal generated by an output from decode logic 4000 is "1", the data is known to be compressed. In this case, the output of the HISTORY RAM 5000 is selected by the multiplexer 5400 as the decompressed data. Just as in the raw token case, this decompressed data is also written back into the HISTORY RAM 5000 via the "write data" port, becoming part of the "history".

The HISTORY RAM 5000 readout is based on the DISPLACEMENT__2 address. The RAM has only L1 latch outputs, requiring the RAM outputs to be flushed through an external L1 5310 which then feeds a normal B-CLOCK L2 5320. It would be apparent that the C2-CLOCK is tied to "1" during normal usage, causing the L1 to "flush". The L2 latch 5320 ends up with the RAM value at pipeline state "__3", hence the name RAMOUT__3

RAMOUT__3 is multiplexed with RAW__3 from register 5200 based on the signal CODED__3 (derived from CODED 2 in FIG. 10A). The output of this multiplexer is the decompressed data which is then written back in the RAM to serve as "history" for future compressed code.

It should be noted that the hold signal needed for the RAMOUT__3 register is the L1 output of the signal HA. This is necessary to avoid a race condition caused by the L1 register being flushed. Another twist is the HA(L1) latch gets clocked by C1-CLOCK. C1-CLOCK is the same as the C0-CLOCK that goes to every other register in this design, but is useful for test purposes.

Finally, it should be noted that the WRITE ADDRESS is a "__3" pipeline stage signal that simply increments every time WHOLE__3 is true. When the address gets to maximum (either 512, 1K, or 2K; depending on RAM size), it wraps around to zero and starts to increment again (e.g. For 512 RAM: 509, 510, 511, 000, 001 . . . ). As a result, the HISTORY RAM reads out at "__2" time but writing to the RAM is done at "__3" time.

Finally, the decompressed data outputs to an interface that takes 8-bits of decompressed data per cycle and outputs it onto a 16-bit bus every other cycle. If the decompressed data is the last, as indicated by an end code token, the activity is terminated.

Although the present invention has been described above with reference to certain specific embodiments, other alternative embodiments may be apparent to those of ordinary skill in the art. Accordingly, the above description should not be taken as limiting the scope of the present invention which is defined by the appended claims.

We claim:

1. An apparatus for processing compressed, variable length data items in a data compression system, said apparatus comprising:

code storing means for storing variable length code items, each code item representing a corresponding variable length data item and comprising a corresponding number of code bits which are within one of a predetermined number of possible variable length code cases;

means for decoding said stored code bits and outputting a signal identifying a length case within one of said possible variable length code cases;

means for concurrently generating the sums of the number of code bits in each of said variable length code bit cases and a starting address of a first code item in order to generate a plurality of possible starting addresses for a second code item; and means for selecting one of said plurality of possible starting addresses for said second code item on the basis of the signal output by said decoding means.

2. A processing apparatus as set forth in claim 1 further comprising:

data item storing means for storing variable length data items, said data item storing means having a plurality of addresses and being of a predetermined size, wherein each data item necessarily has an actual length value, said actual length value being within one of a predetermined number of possible length cases and being represented by code bits which are within one of said predetermined number of possible variable length code cases; and wherein the number of code bits provided for each code case by said concurrent generating means relates to the size of said data item storing means.

3. A processing apparatus as set forth in claim 1 further comprising:

code length storing means for storing each of said variable length possibilities and outputting a plurality of said possibilities in parallel;

adder means for receiving each of said outputted variable length possibilities and said starting address for a first code item, said adder means providing in parallel said plurality of possible starting addresses for said second code item.

4. An apparatus for processing a plurality of sequentially arranged compressed code tokens representing original data, each code token having one of a plurality of possible variable lengths and comprising compression information and code length information, said apparatus comprising:

a) means for storing code tokens, said means being of sufficient size to store each of a first code token and a second code token, each said stored tokens being any one of said possible variable lengths;

b) means for aligning said stored code tokens for providing aligned storage locations for said first and second code tokens irrespective of code token length;

c) means for decoding said code length information for said first stored code token and identifying one of said plurality of code lengths;

d) means for providing a current address, said current address being used to determine the location of said first code token in said token storing means;

e) means for concurrently providing all of said plurality of possible variable code length values;

f) means responsive to said plurality of possible variable code length values and said current address for generating a plurality of possible next addresses for said second code token; and g) means responsive to said decoding means for selecting a next address in said token storing means for said second code token.

5. The processing apparatus as set forth in claim 4 wherein said length providing means comprises fixed length means for generating a predetermined plurality of variable fixed length values, and a plurality of adder means each for receiving a current address value and corresponding variable address size for generating a plurality of possible next addresses.

6. The processing apparatus as set forth in claim 4 wherein said alignment means comprises a barrel shifter memory operative to receive each of said code tokens separately.

7. The processing apparatus as set forth in claim 6 wherein said barrel shifter memory provides left-adjustment for received tokens.

8. The processing apparatus as set forth in claim 4 further comprising means for receiving at least part of each variable length code token and assembling said parts in said storage means as a complete token.

9. The processing apparatus as set forth in claim 4 further comprising means for determining if said entire current code token is stored in said storing means by comparing each said possible next address with available segment data.

10. The processing apparatus as set forth in claim 9 further comprising output means for storing an entire adjusted code word from said adjusting means in response to said determining means.

11. The processing apparatus as set forth in claim 10 further comprising means responsive to said current address and available segment data for delaying the introduction of a new code token until a current code token is decompressed.

12. A data compression and decompression system comprising:
   a) a data compressor for receiving variable length data elements and generating variable length codes comprising raw data tokens, comprising raw data and a length code, and compressed word tokens for data elements that match previously received data elements, said compressed word tokens comprising a compression code, an address and a variable length code representing one of a predetermined number of variable length possibilities; and
   b) a data decompressor comprising:
      i) means for storing variable length tokens, said storage means having a plurality of addresses;
      ii) means for decoding said length code of a first variable length code and outputting a signal identifying one of said length possibilities;
      iii) means for adding in parallel all variable length possibilities of said first variable length code to its starting address to generate plural possible next addresses; and
      iv) means for selecting one of said possible next addresses as the starting addresses for a subsequent variable length code on the basis of the output of said decoding means.

13. A compression and decompression system as set forth in claim 12 wherein said adding means comprises means for storing a predetermined plurality of variable fixed length values, and a plurality of adders each for receiving a common starting address value and a respective variable address size for generating said plurality of possible next addresses.

14. A compression and decompression system as set forth in claim 12 further comprising in said decompressor a means for determining if said entire current code token is stored in said storing means by comparing each said possible next address with available segment data.

15. A compression and decompression system as set forth in claim 12, said decompressor further comprising:
   history buffer means for storing decompressed raw data;
   output means for storing an entire code word position-adjusted in common with respect to all other code words and outputting said code word in response to said selecting means; and
   decode means for decoding said output code word and controlling storage of variable length data elements in said history buffer means.

16. A method of decompressing compressed data, said compressed data being represented by a code token comprising a status code indicating its status as compressed data, a length code indicating its length within a predetermined plurality of length value cases and an address in a history memory, comprising:
   a) decoding said length code and identifying one of said plurality of length value cases,
   b) concurrently with said decoding step, determining an identity between a plurality of possible next code token addresses and an available code token storage area by
      (i) adding all possible code lengths to a current code token address for generating plural possible next addresses, and
      (ii) determining for said plural possible next code token addresses on the basis of an available storage segment an identity of values; and
   c) selecting a next code token address on the basis of said identified length value cases and said determined identity of values.

17. The method as set forth in claim 16, further comprising:
   selecting said length code value on the basis of the size of said history memory.

18. The method as set forth in claim 16, further comprising:
   aligning said stored code tokens for providing aligned storage locations for said first and second code tokens irrespective of code token length.

19. The method as set forth in claim 18, wherein said aligning step comprises barrel shifting each of said code tokens separately.

20. The method as set forth in claim 16, comprising:
   receiving at least part of each variable length code token and assembling said parts in said storage means as a complete token; and
   determining if said entire current code token is stored in said storing means by comparing each said possible next address with available segment data.

* * * * *